United States Patent
Murakami et al.

(10) Patent No.: US 8,196,610 B2
(45) Date of Patent: Jun. 12, 2012

(54) CONTROLLING COOLING FLUID FLOW IN A COOLING SYSTEM WITH A VARIABLE ORIFICE

(75) Inventors: Vance B. Murakami, Los Gatos, CA (US); Tony Willever, San Jose, CA (US); John M. Grisham, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1355 days.

(21) Appl. No.: 11/881,286

(22) Filed: Jul. 26, 2007

(65) Prior Publication Data

US 2009/0025416 A1    Jan. 29, 2009

(51) Int. Cl.
*G05D 7/00*    (2006.01)
(52) U.S. Cl. .................. 138/45; 165/104.14; 251/212
(58) Field of Classification Search .................. 251/212; 138/38, 45, 46; 165/104.14, 80.4
See application file for complete search history.

(56) References Cited

U.S. PATENT DOCUMENTS

| | | | | |
|---|---|---|---|---|
| 1,595,657 A * | 8/1926 | Halloran | .................. | 137/565.12 |
| 2,037,663 A * | 4/1936 | Lalor | .................. | 251/212 |
| 2,321,336 A * | 6/1943 | Tondreau | .................. | 251/212 |
| 2,643,282 A * | 6/1953 | Greene | .................. | 174/15.1 |
| 2,649,272 A * | 8/1953 | Barbato | .................. | 251/212 |
| 2,751,715 A * | 6/1956 | Denman | .................. | 65/356 |
| 2,830,617 A * | 4/1958 | Brown | .................. | 137/553 |
| 3,101,736 A * | 8/1963 | Egger | .................. | 137/242 |
| 3,642,020 A | 2/1972 | Payne | | |
| 3,776,305 A * | 12/1973 | Simmons | .................. | 165/104.25 |
| 4,044,396 A * | 8/1977 | Haws et al. | .................. | 361/698 |
| 4,094,492 A * | 6/1978 | Beeman et al. | .................. | 251/212 |
| 4,139,356 A | 2/1979 | Hattori | | |
| 4,232,595 A * | 11/1980 | Cox | .................. | 454/29 |
| 4,263,787 A | 4/1981 | Domingorena | | |
| 4,353,500 A | 10/1982 | Brown | | |
| 4,771,824 A * | 9/1988 | Rojey et al. | .................. | 165/104.13 |
| 4,793,405 A * | 12/1988 | Diggelmann et al. | .................. | 165/104.33 |
| 5,031,416 A | 7/1991 | Drucker et al. | | |
| 5,333,677 A * | 8/1994 | Molivadas | .................. | 165/272 |
| 5,897,099 A | 4/1999 | Fujimoto et al. | | |
| 5,927,400 A * | 7/1999 | Bononi et al. | .................. | 165/295 |
| 6,375,155 B1 * | 4/2002 | Janssens | .................. | 251/212 |
| 6,666,237 B2 | 12/2003 | De Antoni Migliorati | | |
| 6,874,576 B2 * | 4/2005 | Grundbacher | .................. | 165/299 |
| 6,896,240 B2 * | 5/2005 | Wijaya | .................. | 251/212 |

(Continued)

FOREIGN PATENT DOCUMENTS

JP    5-99835    4/1993
JP    2006-336943    12/2006

OTHER PUBLICATIONS

International Application No. PCT/US2008/006706 form PCT/ISA/220 & PCT/ISA/210 Mailed Dec. 15, 2008.

(Continued)

*Primary Examiner* — John Bastianelli

(57) ABSTRACT

In a cooling system, a variable orifice controls the flow of cooling fluid through a cooling fluid flow path. The variable orifice includes an adjustable diaphragm shutter through which the cooling fluid flows. Upon manipulation of the adjustable diaphragm shutter, a diameter of an opening of the adjustable diaphragm shutter is adjusted to control the flow of the cooling fluid.

16 Claims, 3 Drawing Sheets

U.S. PATENT DOCUMENTS

| | | | |
|---|---|---|---|
| 6,979,939 B2* | 12/2005 | Langlois et al. | 313/22 |
| 7,019,782 B2 | 3/2006 | Engel | |
| 2006/0112773 A1 | 6/2006 | Hedtke | |
| 2006/0283579 A1* | 12/2006 | Ghosh et al. | 165/104.33 |
| 2007/0034355 A1* | 2/2007 | Kuo | 165/80.4 |

OTHER PUBLICATIONS

Diaphragm—(Photography): Definition, MiMi.hu, http://en.mimi.hu/photography/diaphragm.html, Jun. 7, 2007, p. 1-6.

* cited by examiner

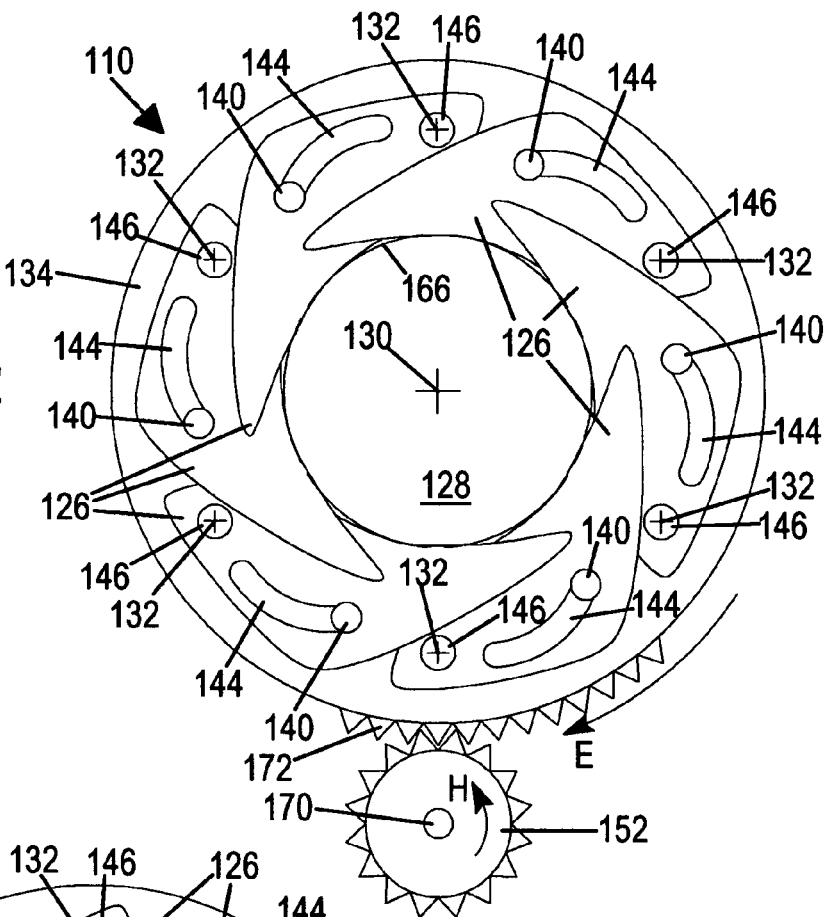
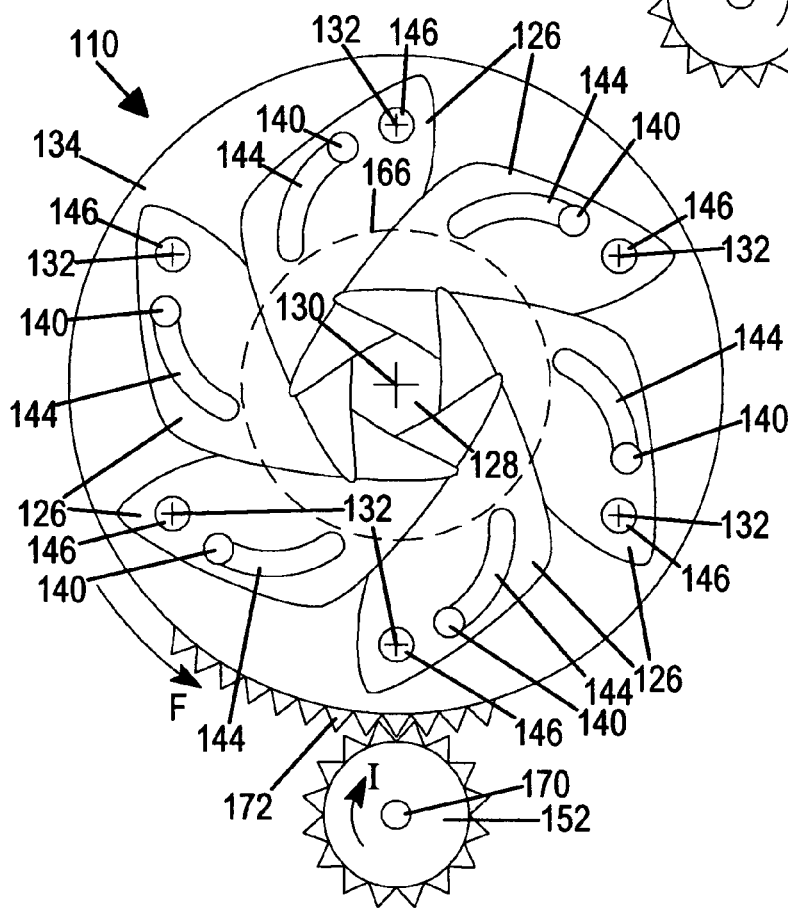

CONTROLLING COOLING FLUID FLOW IN A COOLING SYSTEM WITH A VARIABLE ORIFICE

BACKGROUND

Some cooling systems, such as those required to cool electronic equipment, need to regulate the flow of cooling fluid through the system, so that the system doesn't provide too little or too much cooling capacity to the electronic equipment. Too little cooling will allow the electronic equipment to overheat, thereby causing underperformance by or damage to the electronic equipment or its surroundings. Too much cooling can consume too much power by the cooling system, generate condensation within the electronic equipment and/or allow unwanted phase changes to occur in the cooling fluid (e.g. if the cooling fluid is water), among other potential problems.

Some cooling systems employ flow-regulating devices, or orifices, inline with the cooling fluid path. Flow-regulating devices reduce the flow rate of the cooling fluid through the cooling system by a specified amount. Upon designing a cooling system for a given set of electronic devices, such as a rack-mounted computerized system, a flow-regulating device is selected that provides the necessary flow regulation depending on the cooling capacity of the cooling system and the anticipated level of heat generation by the electronic equipment.

If the electronic devices or a part of the cooling system is changed requiring a different flow rate, fluid velocity or static pressure for the cooling fluid, then the flow-regulating device may have to be replaced. Replacing the flow-regulating device requires turning off the flow of the cooling fluid both upstream and downstream from the flow-regulating device. Then the flow-regulating device can be removed with a minimum of loss of cooling fluid. A new flow-regulating device is inserted, the lost cooling fluid is replaced and the flow of the cooling fluid is turned back on.

Since the flow of the cooling fluid must be turned off, the electronic equipment also has to be shut down, in order to prevent overheating of and possible damage to the electronic equipment and its surroundings. However, it is costly and time consuming to go through the operation of turning off the electronic equipment, turning off the cooling system, replacing the flow-regulating device, turning on the cooling system and turning back on the electronic equipment. Depending on circumstances, a considerable interruption of business operations can result when electronic equipment, such as computer server systems, is turned off for any period of time. It is thus with extreme reluctance that information technology (IT) managers take such drastic action within an enterprise.

BRIEF DESCRIPTION OF THE DRAWINGS

FIG. 2 is a simplified end view of a portion of an exemplary variable orifice for use in the exemplary cooling system shown in FIG. 1 incorporating an embodiment of the present invention.

FIG. 3 is another simplified end view of the portion of the exemplary variable orifice shown in FIG. 2 incorporating an embodiment of the present invention.

DETAILED DESCRIPTION

Figure 1:
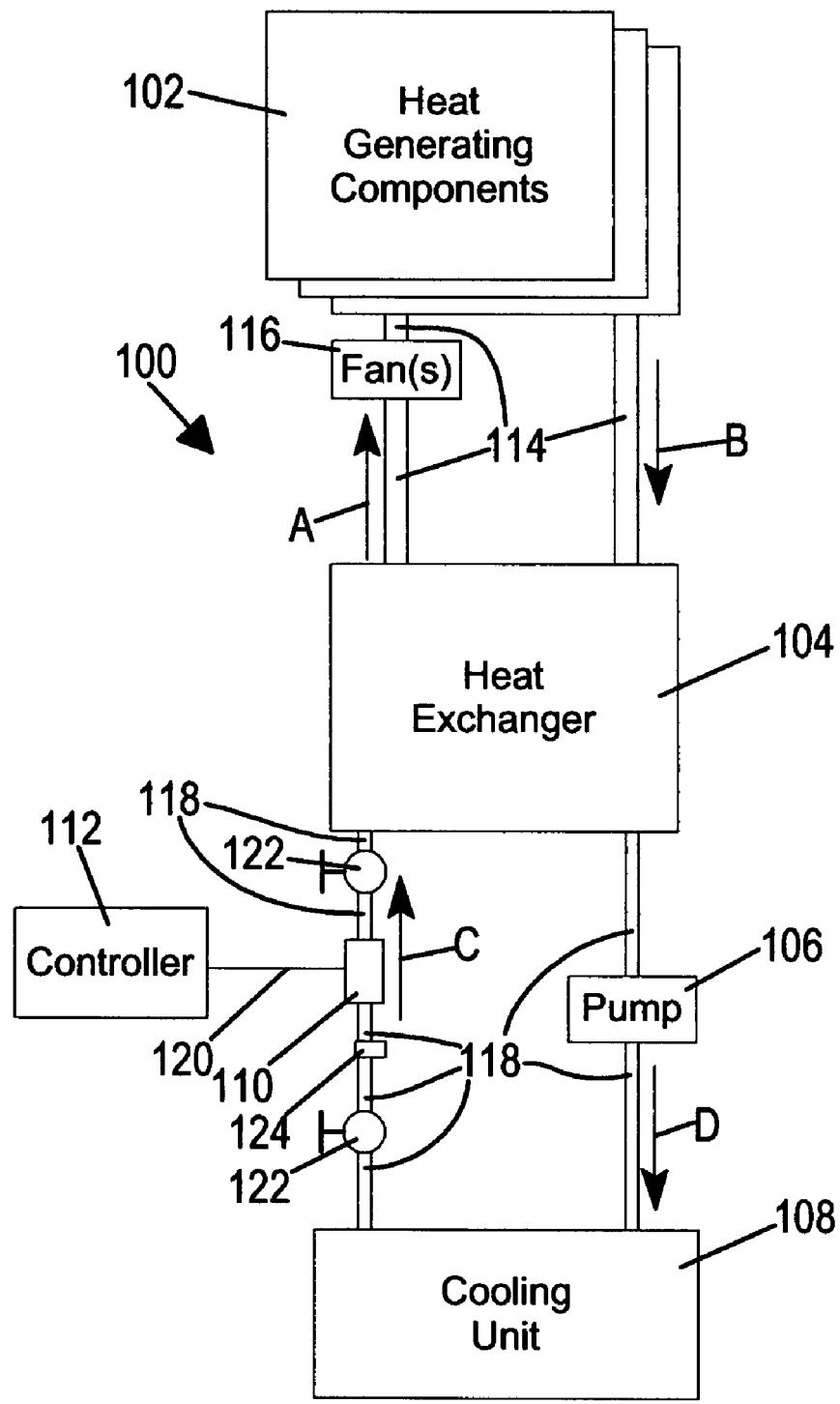
FIG. 1 is a simplified schematic of an exemplary cooling system with heat generating components and incorporating an embodiment of the present invention.

An exemplary cooling system 100 for cooling heat generating electronic components 102, such as rack-based computer-related devices, is shown in FIG. 1 incorporating an embodiment of the present invention (as described below). The cooling system 100 generally includes a heat exchanger 104, a pump 106, a cooling unit 108, a variable orifice 110 and a controller 112, among other components. The variable orifice 110 is inline with a cooling fluid flow path in the cooling system 100. The variable orifice 110 regulates the flow rate of the cooling fluid that flows in the flow path through the heat exchanger 104, the pump 106, the cooling unit 108 and the variable orifice 110. The variable orifice 110 can vary the amount or degree to which it regulates or restricts the flow of the cooling fluid, as described below, and thus the cooling capacity of the cooling system 100. In this manner, the variable orifice 110 can be used over a much greater range of desired flow rates for the cooling fluid, and of desired cooling capacity for the cooling system 100, than can a flow-regulating device that cannot be varied. Therefore, when the cooling capacity requirements change for the cooling system 100, e.g. when the electrical power consumption of the heat generating components 102 changes, or if a different fluid velocity or static pressure is required, the variable orifice 110 can be adjusted for a different flow rate, instead of being replaced, under a greater range of conditions than can a non-variable flow-regulating device. Thus, the need to shut down the heat generating components 102, and potentially interrupt significant business operations, occurs less often when the variable orifice 110 is used in the cooling system 100 than when a non-variable flow-regulating device is used.

The flow of the cooling fluid needs to be kept within a specified range for a variety of reasons. In the case of water as the cooling fluid, for instance, care must be taken to ensure that the water does not freeze or vaporize in the flow path to ensure proper functioning of the cooling system 100. For "phase-change" cooling fluids, on the other hand, the temperature range of the cooling fluid must be such that the cooling fluid can properly evaporate and condense as it cycles through the cooling system 100. Additionally, since the heat generating components 102 (and other surrounding components) are electronic and can be damaged by water, it is undesirable for condensation of ambient moisture to occur on or near these components 102. Therefore, when the heat generation conditions change (e.g. some components 102 are added, replaced or removed), it is vitally important that the cooling capacity of the cooling system 100 change in order to keep the components 102 and its surroundings above the condensation point. Thus, the variable orifice 110 serves to be able to rapidly and efficiently respond to such changing conditions by adjusting the flow rate, and hence the cooling capacity, of the cooling fluid.

The heat generating components 102 are cooled by air flowing through or across the components 102. The cooling air is transferred in a path (arrows A and B) from the heat exchanger 104 to the heat generating components 102 and back again through a variety of ducts, conduits and passageways 114 by one or more fans 116. The fan(s) 116 are located at any appropriate point(s) within the path of the flowing air.

Within the heat exchanger 104, the temperature of the cooling air is reduced by passing the heat to the cooling fluid, such as water, Freon, etc. The cooling fluid is forced through the flow path (arrows C and D) from the cooling unit 108 to the heat exchanger 104 and back again through a variety of pipes, tubes and hoses 118. In the cooling unit 108 (e.g. an evaporator, etc.), the cooling fluid is cooled back down.

The pump 106 is located at any appropriate point in the path of the cooling fluid. The pump 106 forces the cooling fluid to flow through the cooling fluid path. However, adjusting the operation of the pump 106 to increase or decrease the flow rate of the cooling fluid is not a preferred option, because under some circumstances and with some types of pumps, better control of the flow rate and/or better performance of the pump is achieved with a separate flow-regulating device, hence the need for the variable orifice 110.

The controller 112 is electrically connected to the variable orifice 110 by signal wires 120. The controller 112 may be a computer, or other appropriate device, that can control the amount to which the variable orifice 110 restricts or regulates the flow rate of the cooling fluid, as exemplified below. The controller 112 may be set by a user to a specified value to which the variable orifice 110 is adjusted. Alternatively, the controller 112 may be dynamically controlled according to an appropriate algorithm that receives various inputs indicative of relevant parameters, such as the temperature or power consumption of the heat generating components 102 and the ambient air temperature and humidity, among other possible inputs.

Optional stop valves 122 may be placed inline at upstream and downstream locations from the variable orifice 110. Additionally, an optional tap 124 may be placed between the stop valves 122. Such stop valves 122 are not optional, but required, for cooling systems having non-variable flow-regulating devices, since the non-variable flow-regulating devices have to be replaced when the cooling requirements of the cooling systems change. In such situations, the stop valves 122 are closed to stop the flow of the cooling fluid. Then the flow-regulating device can be removed without significant loss of the cooling fluid. After installing a new flow-regulating device, the air that has gotten into the pipes, tubes and/or hoses 118 between the stop valves 122 is evacuated at the tap 124. Additionally, any new cooling fluid needed to replace cooling fluid that was lost during this operation is injected at the tap 124. In the cooling system 100 having the variable orifice 110, on the other hand, the stop valves 122 and the tap 124 may not be needed, since the variable orifice 110 enables operation of the cooling system 100 over a much greater range of conditions than does the non-variable flow-regulating device. However, the stop valves 122 and the tap 124 may be included in the cooling system 100 in case the variable orifice 110 ever needs to be removed, serviced or replaced.

Figure 4:
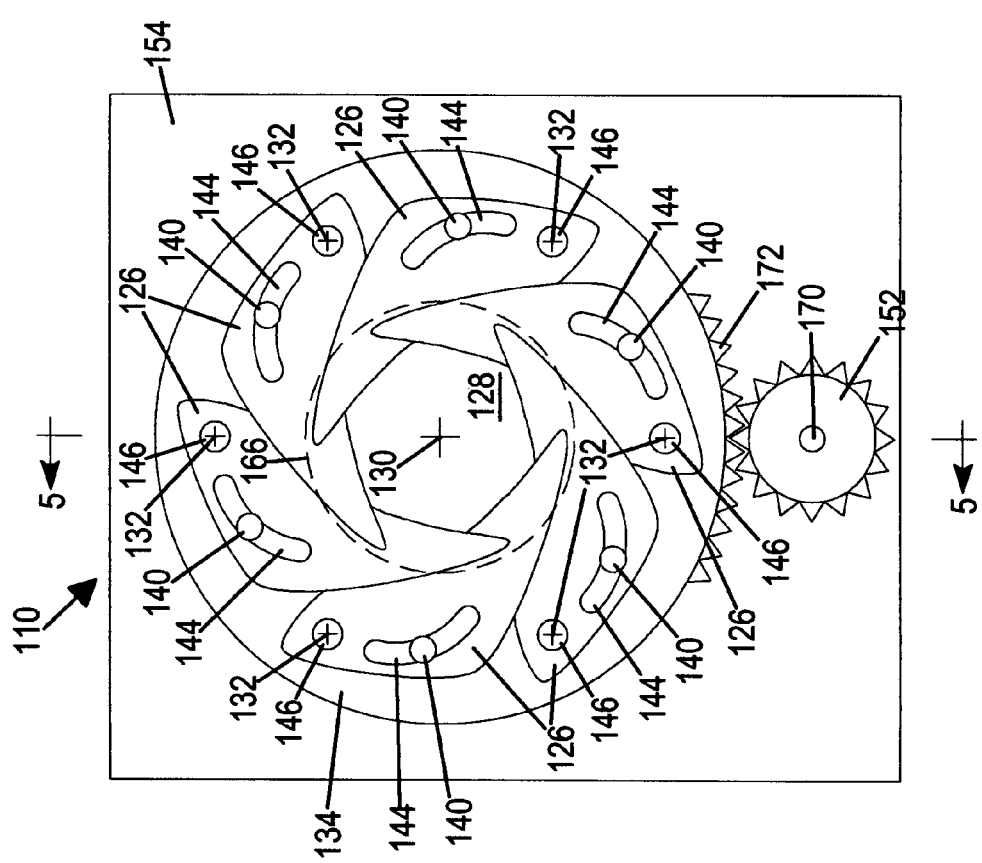
FIG. 4 is another simplified end view of another portion of the exemplary variable orifice shown in FIG. 2 incorporating an embodiment of the present invention.

According to various embodiments, the variable orifice 110 generally includes any appropriate number of curved overlapping blades 126 that define an opening 128 through the variable orifice 110, as shown in FIGS. 2-4. The overlapping blades 126 are symmetrically arranged around a center point 130 of the opening 128. According to some embodiments, the overlapping blades 126 preferably have a concave curvature on a side edge that defines the opening 128 in order to make the opening 128 as relatively rounded, or circular, as possible. Additionally, each blade 126 pivots about a pivot point 132 inwardly towards and outwardly away from the center point 130. In this manner, the opening 128 can be made relatively large (e.g. as in FIG. 2), relatively small (e.g. as in FIG. 3) or in between (e.g. as in FIG. 4).

The overlapping blades 126 form an "adjustable diaphragm shutter" that is similar to a lens diaphragm of a camera. In a camera, the lens diaphragm (also known as an aperture, a lens aperture, a shutter, a leaf shutter, a diaphragm shutter, an iris diaphragm, etc.) defines an opening in the lens that performs the function of an iris of an animal's eye to allow light to pass through it to expose film (or other recording medium) within the camera. This opening can be made larger or smaller to allow more or less light to pass through the lens. The typical camera lens diaphragm is comprised of a number of overlapping (or interleaving) metal "blades" or "leaves," which are continuously adjustable to change the size of the opening from relatively wide open to almost fully closed.

Instead of regulating the passage of light, the overlapping blades 126 regulate the flow of the cooling fluid through the variable orifice 110. Thus, upon manipulation of the overlapping blades 126, a diameter of the opening 128 is adjusted to control the flow of the cooling fluid, including lowering the pressure of the cooling fluid at the exit of the variable orifice 110. For example, when the overlapping blades 126 are outwardly pivoted for a relatively large opening 128 (FIG. 2), the diameter of the opening 128 is preferably maximized. In this configuration, the overlapping blades 126 allow for a maximum flow rate, with no pressure drop, of the cooling fluid through the variable orifice 110, and thus the cooling system 110. Alternatively, when the overlapping blades 126 are inwardly pivoted for a relatively small opening 128 (FIG. 3), the diameter of the opening 128 is preferably minimized. In this configuration, the overlapping blades 126 minimize the flow rate, with a maximum pressure drop, of the cooling fluid through the variable orifice 110. Furthermore, the overlapping blades 126 can preferably be pivoted to almost any intermediate angle (e.g. as in FIG. 4) in order to regulate the flow rate and pressure drop of the cooling fluid between the maximum and the minimum. According to some embodiments, the overlapping blades are continuously adjustable between the maximum and the minimum diameter of the opening.

The following description of a design for the variable orifice 110 is exemplary only. Other mechanisms for inserting the variable orifice 110 in the path of the cooling fluid and for containing and pivoting the overlapping blades 126 to increase or decrease the diameter of the opening 128 to regulate the flow rate of the cooling fluid are contemplated by the present invention.

Figure 5:
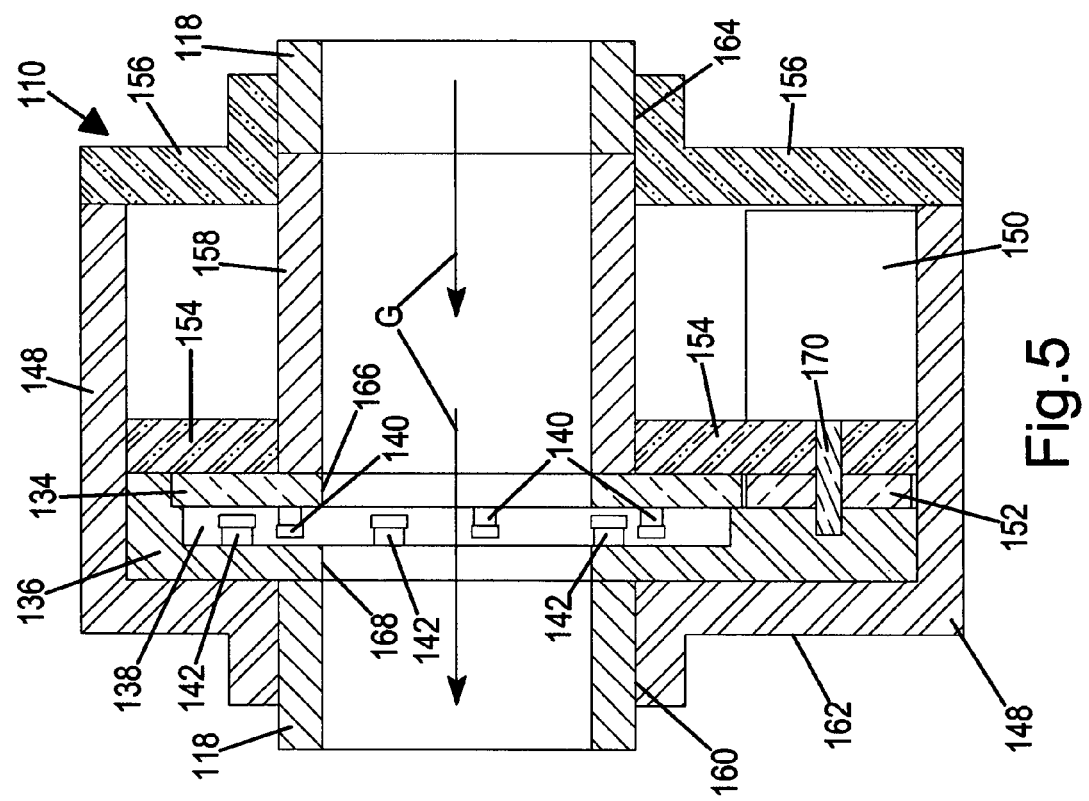
FIG. 5 is a simplified cross section view taken along section line 5-5 in FIG. 4 of the portion of the exemplary variable orifice shown in FIG. 4 and showing additional components of the exemplary variable orifice incorporating an embodiment of the present invention.

In addition to the overlapping blades 126, the exemplary design of the variable orifice 110 further includes a rotatable disk 134 and a stationary backing plate 136, as shown in FIG. 5. The overlapping blades 126 are sandwiched between the rotatable disk 134 and the stationary backing plate 136. The rotatable disk 134 and the stationary backing plate 136 define an open space 138 within which the overlapping blades 126 are disposed. The overlapping blades 126 are not shown in the cross section view of FIG. 5 in order to more clearly show portions of two sets of press pins 140 and 142, or other appropriate components, protruding into the open space 138.

Each overlapping blade 126 has a curved slot 144 and a pivot hole 146 (FIGS. 2-4). Each press pin 140 is attached to the rotatable disk 134 and protrudes through a corresponding one of the overlapping blades 126 at the curved slot 144 therein. Each press pin 142, on the other hand, is attached to the stationary backing plate 136 and protrudes through a corresponding one of the overlapping blades 126 at the pivot hole 146 therein. The press pins 142 hold the overlapping blades 126 in such a manner as to allow the overlapping blades 126 to pivot about the pivot points 132. As the rotatable disk 134 rotates (arrows E and F, FIGS. 2 and 3, respectively), the press pins 140 slide through the curved slots 144 and cause the overlapping blades 126 to pivot as indicated.

According to the embodiment shown, the exemplary design of the variable orifice 110 also includes a housing 148, a motor 150, a gear 152, a mid plate 154, a covering plate 156 and a tube 158. The pipes, tubes and/or hoses 118 (FIGS. 1 and 5) attach in any appropriate manner to the variable orifice 110 at a hole 160 in a face 162 of the housing 148 and at a hole 164 of the covering plate 156.

The rotatable disk 134 and the stationary backing plate 136 have openings 166 and 168, respectively. The cooling fluid, thus, flows from one of the pipes, tubes and/or hoses 118, through the tube 158, the openings 166 and 168 and the opening 128 in the overlapping blades 126 to the other of the pipes, tubes and/or hoses 118 (in the direction of arrows G, or the reverse thereof). The openings 166 and 168 are preferably of the same diameter as an inner diameter of the tube 158, which is preferably, but not necessarily, the same as an inner diameter of the pipes, tubes and/or hoses 118, in order to minimize disruptions or changes in the flow of the cooling fluid due to connections between each of these components. Additionally, the maximum diameter of the opening 128 in the overlapping blades 126 is preferably approximately the same as or greater than the diameter of the openings 166 and 168 and of the inner diameter of the tube 158, in order not to disrupt the flow of the cooling fluid when the opening 128 is maximized. The overlapping blades 126 are used to regulate this flow by changing the diameter of the opening 128 from the maximum to the minimum, as described above.

The rotatable disk 134 is seated between the stationary backing plate 136 and the mid plate 154 in such a manner as to allow the rotatable disk 134 to rotate approximately between the extents (shown in FIGS. 2 and 3) necessary to maximize and minimize the diameter of the opening 128. The motor 150 and gear 152, according to signals from the controller 112 (FIG. 1), control this movement.

The motor 150 is mounted in a cavity defined by the housing 148, the mid plate 154, the covering plate 156 and the tube 158. The cooling fluid is preferably sealed away from this cavity, so as not to disrupt the motor 150. A drive shaft 170 protruding from the motor 150 extends through the mid plate 154. The gear 152 is attached to the drive shaft 170 between the mid plate 154 and the stationary backing plate 136. The drive shaft 170 and the gear 152 are free to rotate under power from the motor 150. The gear 152 engages a set of gear teeth 172 on the rotatable disk 134 (FIGS. 2-4). The gear 152, thus, rotates (arrows H and I, FIGS. 2 and 3, respectively) under power of the motor 150 to cause the rotatable disk 134 to rotate (arrows E and F, respectively) to increase and/or decrease the diameter of the opening 128.

We claim:

1. A cooling system for an electronic device, the cooling system comprising:
    a cooling fluid flow path through which a cooling fluid flows;
    a variable orifice in the cooling fluid flow path and comprising an adjustable diaphragm shutter comprising overlapping blades that form an opening through which the cooling fluid flows, wherein upon manipulation of the adjustable diaphragm shutter, a diameter of the opening is adjusted to control the flow of the cooling fluid;
    the cooling fluid flow path comprising a pipe attached to the variable orifice and through which the cooling fluid flows to the variable orifice;
    a pump to force the cooling fluid through the pipe and variable orifice; and
    a heat exchanger that passes heat from a cooling air to the cooling fluid, wherein the pump forces the cooling fluid via the cooling fluid flow path through the heat exchanger, and wherein a fan transfers the cooling air via a cooling air flow path through the heat exchanger to across heat generating components of the electronic device.

2. A cooling system as defined in claim 1, wherein:
    the variable orifice controls a pressure decrease in the cooling fluid; and
    the cooling fluid comprises water or Freon.

3. A cooling system as defined in claim 1, wherein the overlapping blades each have a concave curvature on a side edge that defines the opening, and the overlapping blades are continuously adjustable between a maximum and a minimum diameter of the opening.

4. A cooling system as defined in claim 1, wherein a maximum diameter of the opening matches an inner diameter of the pipe.

5. A method for controlling cooling fluid flow in a cooling system of an electronic device, the method comprising:
    forcing via a pump the cooling fluid comprising a liquid through a cooling fluid flow path which includes a variable orifice that has an adjustable diaphragm shutter comprising overlapping blades that form an opening through which the cooling fluid flows, wherein the cooling fluid flow path comprises a pipe attached to the variable orifice and through which the cooling fluid flows to the variable orifice;
    manipulating the adjustable diaphragm shutter to change a diameter of the opening, the change in the diameter of the opening causing a change in a flow rate of the cooling fluid to control temperature in the electronic device; and
    a heat exchanger that passes heat from a cooling air to the cooling fluid, wherein the pump forces the cooling fluid via the cooling fluid flow path through the heat exchanger, and wherein a fan transfers the cooling air via a cooling air flow path through the heat exchanger to across heat generating components of the electronic device.

6. A method as defined in claim 5, wherein:
    the manipulating of the adjustable diaphragm shutter comprises adjusting the overlapping blades between a maximum and a minimum diameter of the opening.

7. A method as defined in claim 6, wherein adjusting of the overlapping blades comprises pivoting the overlapping blades toward a center point of the opening to decrease the diameter of the opening and decrease the flow rate of the cooling fluid.

8. The cooling system of claim 1, wherein the overlapping blades each have a curved slot to receive a respective pin to facilitate adjusting of the overlapping blades.

9. The method of claim 5, wherein the cooling fluid comprises water.

10. The method of claim 6, wherein manipulating the adjustable diaphragm shutter comprises adjusting the overlapping blades via respective curved slots on the overlapping blades.

11. The cooling system of claim 1, comprising a cooling unit to cool the cooling fluid, wherein the pump forces the cooling fluid via the cooling fluid flow path through the cooling unit.

12. The cooling system of claim 1, comprising:
    the electronic device, wherein the cooling system removes heat from heat generating components of the electronic device; and a controller electrically connected to the variable orifice by signal wires, wherein the controller controls an amount to which the variable orifice restricts the flow of the cooling fluid.

13. A cooling system for an electronic device, the cooling system comprising:
   a heat exchanger that passes heat from a cooling air to a cooling fluid;
   a fan that transfers the cooling air via a cooling air path through the heat exchanger to across heat generating components of the electronic device;
   a cooling unit that cools the cooling fluid;
   a pump that circulates the cooling fluid via a cooling fluid flow path through the heat exchanger and the cooling unit; and
   a variable orifice in the cooling fluid flow path and comprising an adjustable diaphragm shutter comprising overlapping blades the form an opening through which the cooling fluid flows, wherein upon manipulation of the adjustable diaphragm shutter, a diameter of an opening of the adjustable diaphragm shutter is adjusted to control flow rate of the cooling fluid.

14. The cooling system of claim 13, comprising a controller electrically connected to the variable orifice by signal wires, wherein the controller controls an amount to which the variable orifice regulates the flow rate of the cooling fluid, and the variable orifice causes a pressure drop in the cooling fluid across the variable orifice.

15. The cooling system of claim 13, comprising the electronic device having the heat generating components, wherein the cooling system removes heat from the heat generating components.

16. The cooling system of claim 13, wherein:
   the overlapping blades each have a concave curvature on a side edge that defines the opening; and
   the fan transfers the cooling air via the cooling air path from the electronic device back to the heat exchanger.

* * * * *

UNITED STATES PATENT AND TRADEMARK OFFICE
CERTIFICATE OF CORRECTION

| | |
|---|---|
| PATENT NO. | : 8,196,610 B2 |
| APPLICATION NO. | : 11/881286 |
| DATED | : June 12, 2012 |
| INVENTOR(S) | : Vance B. Murakami et al. |

It is certified that error appears in the above-identified patent and that said Letters Patent is hereby corrected as shown below:

In column 7, line 18, in Claim 13, delete "the" and insert -- that --, therefor.

Signed and Sealed this
Eighteenth Day of December, 2012

David J. Kappos
*Director of the United States Patent and Trademark Office*